United States Patent
Casal et al.

[11] Patent Number: 5,917,356
[45] Date of Patent: Jun. 29, 1999

[54] THREE STATE PHASE DETECTOR

[75] Inventors: Humberto Felipe Casal; Hehching Harry Li, both of Austin; Trong Duc Nguyen, Webster, all of Tex.

[73] Assignee: International Business Machines Corp., Armonk, N.Y.

[21] Appl. No.: 08/526,395

[22] Filed: Sep. 11, 1995

[51] Int. Cl.⁶ .................................................. H03K 3/00
[52] U.S. Cl. .............................. 327/236; 327/3; 327/12; 327/276
[58] Field of Search .................... 327/2, 3, 5, 7, 327/10, 12, 155, 156, 158, 159, 270, 276, 234, 236

[56] References Cited

U.S. PATENT DOCUMENTS

| | | | |
|---|---|---|---|
| 3,600,690 | 8/1971 | White | 327/12 |
| 4,267,514 | 5/1981 | Kimsey | 327/7 |
| 4,922,141 | 5/1990 | Lofgren et al. | 327/277 |
| 4,959,617 | 9/1990 | Martin | 327/12 |
| 5,117,135 | 5/1992 | Lee et al. | 327/7 |
| 5,126,602 | 6/1992 | Lee et al. | 327/12 |
| 5,159,279 | 10/1992 | Shenoi et al. | 327/2 |
| 5,223,755 | 6/1993 | Richley | 327/12 |
| 5,233,636 | 8/1993 | Lee et al. | 375/120 |
| 5,355,037 | 10/1994 | Andresen et al. | 327/277 |
| 5,544,203 | 8/1996 | Casasanta et al. | 327/149 |
| 5,550,878 | 8/1996 | Shigaki et al. | 375/373 |
| 5,552,726 | 9/1996 | Wichman et al. | 327/149 |

FOREIGN PATENT DOCUMENTS

| | | | |
|---|---|---|---|
| 1483593 | 5/1989 | U.S.S.R. | 327/12 |
| 1693714 | 11/1991 | U.S.S.R. | 327/12 |

OTHER PUBLICATIONS

"Clock–skew Chip Targets 66–MHz Designs," Electronic Engineering Times, May 17, 1993, p. 14.

Primary Examiner—Terry Cunningham
Attorney, Agent, or Firm—Kelly K. Kordzik; Winstead Sechrest & Minick P.C.; Mark E. McBurney

[57] ABSTRACT

A phase detector circuit receives both a reference clock signal and a sense clock signal and produces a synchronization signal if the sense and reference clock signals are in phase within a specified tolerance. A lead/lag signal is provided to a skew control circuit and accompanying delay circuits to increase or decrease the amount of delay on the reference clock signal and the sense clock signal if the two signals are not in phase within the specified tolerance. The sense clock signal is a feedback signal returned from logic circuitry, which originally receives the reference clock signal, which may be supplied by a master clock signal within a processor.

13 Claims, 17 Drawing Sheets

DLY= WINDOW BY WHICH PHASE DETECTOR INDICATES THAT
SENSE PHASE & REFERENCE PHASE ARE IN SYNC.

FIG. 2

| A | B | XOR |
|---|---|-----|
| 0 | 0 | 0 |
| 0 | 1 | 1 |
| 1 | 0 | 1 |
| 1 | 1 | 0 |

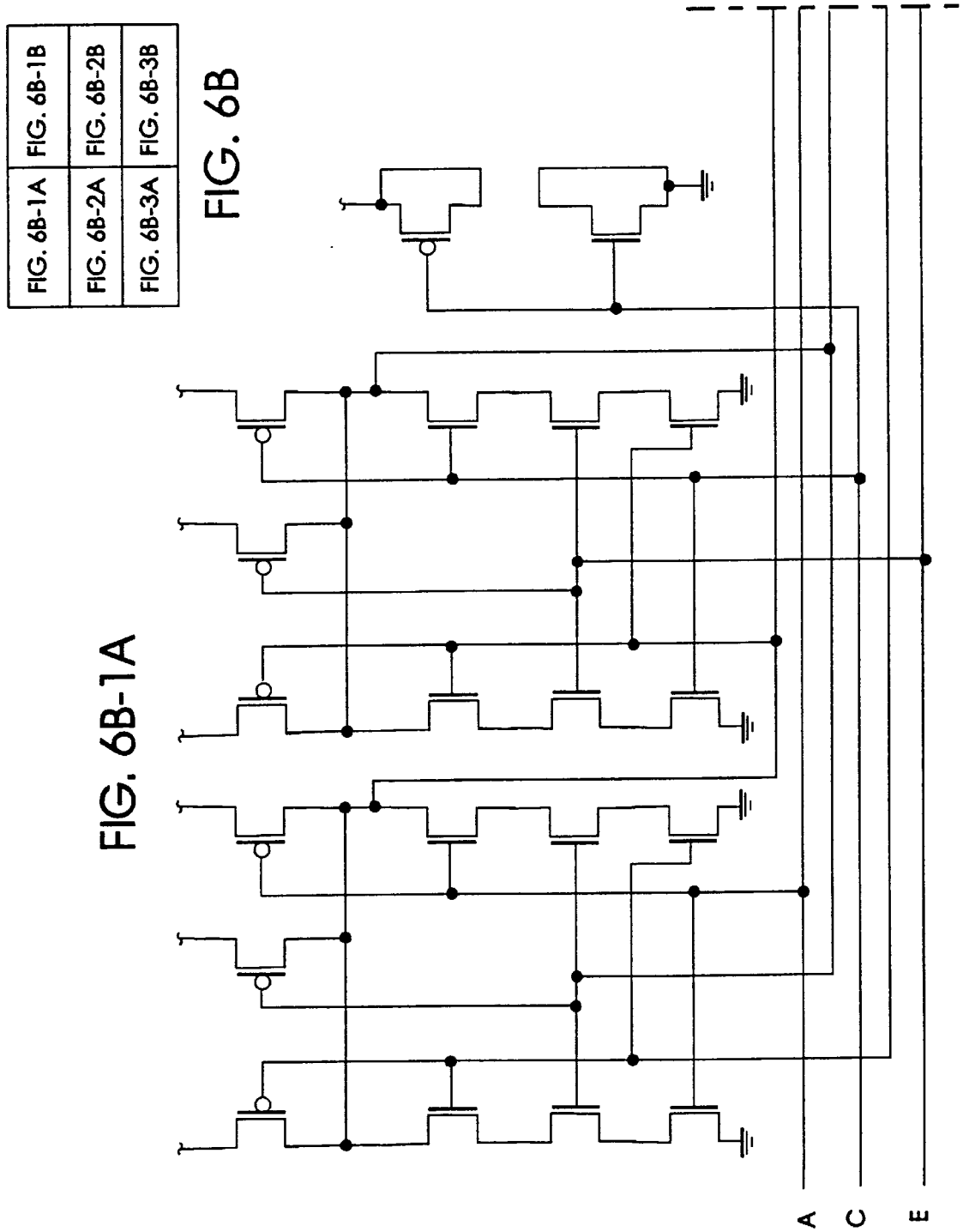

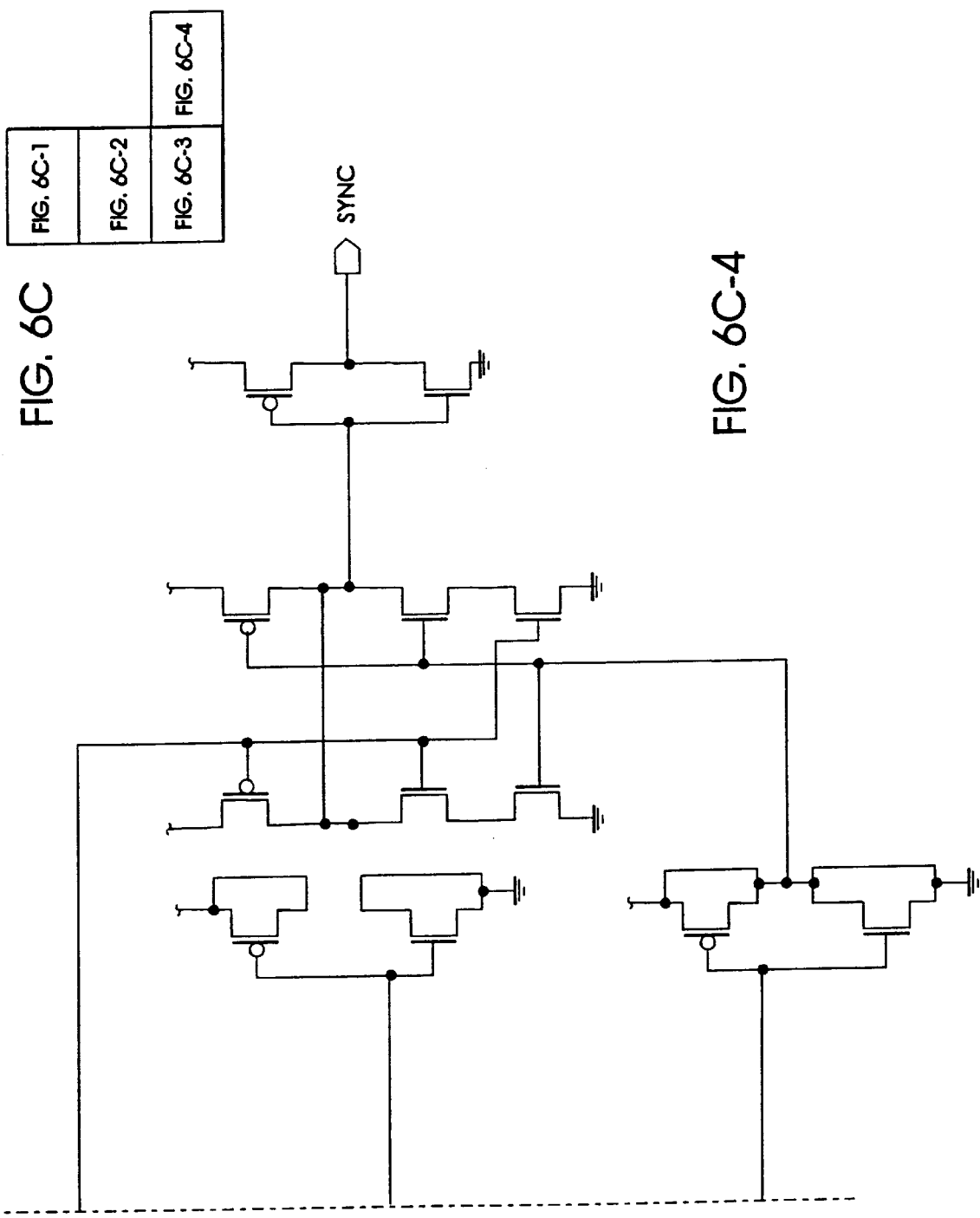

THREE STATE PHASE DETECTOR

TECHNICAL FIELD OF THE INVENTION

The present invention relates generally to a system and method for synchronizing the operation of a network of logic chips. More particularly, the present invention relates to a system and method for determining whether two signals are synchronized to within a predetermined degree of tolerance, and whether a leading or lagging condition exists.

BACKGROUND OF THE INVENTION

Synchronization among individual logic chips within a computer is essential to error free execution of software instructions. Such synchronization has traditionally been accomplished through the use of a clocking system. This system works as follows: A master clock generates alternating high and low voltage signals (interpreted as logical 0's or 1's) at fixed intervals. The signals are buffered through some form of repower tree in order to boost their strength, and then distributed over wires to the individual logic chips. In effect, the rate at which data is processed by the entire computer logic system is set by the rate at which the clock signal pulses.

Theoretically, the only limit on the processing speed of a computer system is that electrical signals cannot travel faster than the speed of light ($0.3 \times 10^9$ ms$^{-1}$). In reality, however, there are other limits. Impedance inherent in circuit board traces slows down the signals. The amount of impedance (and therefore delay) can vary from trace to trace, due to inevitable variations in length, materials, and manufacturing processes. To account for this, computer engineers are forced to choose trace segments that are of uniform length and to adjust the distance between logic chips to offset the variations in impedance.

The processing that occurs within each logic chip also creates delays between receiving inputs and generating outputs. The amount of this delay varies from chip to chip based on its particular characteristics. Variations in the resistance and capacitance loads, temperature variations, as well as material defects can account for the discrepancies among logic chips. It is even possible that two chips manufactured from identical materials, using identical techniques may differ in the amount of delay that signals experience when they reach the chips. Thus, even if two signals arrive at two chips at the same time, the resulting outputs may occur at slightly different times.

It is important that all of the logic chips experience a "high" or "low" condition (generated by the master clock) at the same or nearly the same instant. In other words, they must be operating in synchronization, or in the same phase of the clock cycle. Otherwise, chips will clock data to other chips faster or slower than the receiving chips are prepared to accept. When chips receive timing signals out of sync (synchronization) with data signals, the resulting condition is clock skew.

Clock skew can occur for several possible reasons. Usually, it happens when the timing signal takes a longer path than the data signal. The clock signal could also become skewed if the data buffer chips have different delays than the clock buffer chips. If the chips become far enough out of sync, data may be lost, and critical instructions not processed, resulting in a system failure. This has become an issue in high performance systems, where timing parameters have become much tighter.

In order to determine the proper length for transmission lines, proper placement of logic chips, and the maximum possible processing speed for a given computer architecture, a large amount of simulation with Computer Aided Design (CAD) software is required. Since the actual delay time inherent in the transmission lines and logic chips is never actually known prior to manufacture, simulation of computer architecture must account for a range of possible signal delay times. A worst and best case scenario for every stage of processing in the architecture must be taken into account. The final result of the simulation is a worst and best possible processing speed for the entire system. This now becomes the slowest and fastest possible clock speeds.

There are three basic shortcomings in this approach to chip synchronization. The first is the amount of tuning required to make the system successful at higher clock speeds. In high end systems, or supercomputers, this may necessitate a manual operation wherein technicians tune individual cables in order to line up all of the various sources of delay within the system. This is an expensive procedure to perform on a production basis. The second is that the actual distribution of the clock pulses may compromise the tuning already performed on the system. In order to minimize the effect of clock pulse distribution on a tuned system, it becomes necessary to minimize the number of connectors, cables and other packaging elements. The result is that it is difficult to build a high performance system in anything other than planar (two dimensional) format. The third shortcoming is that the manufacturer never really knows the maximum clock speed for any particular machine. Only the general case is known. Thus, there is no way to speed up performance by taking advantage of better than worst case construction.

To accomplish chip-to-chip synchronization, the chips ideally should be aligned to both the system clock and to each other, and should be realigned during operation to reflect changing loads, impedance, and temperature. This would also allow for higher tolerances in clocking speed, as the system would reflect more accurately the actual delay times. A dynamic method of on-chip timing adjustment could accomplish this task. Such a method would require circuits capable of detecting the amount of delay occurring in the system, and creating internal delays to compensate. One way to sense the amount of clock signal delay being experienced is to compare the phase of the master clock signal to a feedback signal from a distant chip. If the distance between the two chips (i.e., the chip sending the clock signal and the distant chip) is known, then the circuit designer will be able to determine how much difference, under ideal conditions, should exist between the phase of the reference signal and the feedback signal from the distant chip. For example, if the distance between the two chips is such that it takes a signal one clock cycle to travel from the source chip out to the distant chip and return as feedback, then under ideal conditions (with no delay), the master clock signal should be in the same phase as the feedback sense signal. That is, the master clock signal and the feedback signal should rise to a logical state of '1' and drop to a logical state of '0' at the same time.

There is therefore a need for a system and method for comparing a reference clock signal with a feedback signal in order to determine whether they are synchronized. If the signals are not synchronized, then the aforesaid system and method should be able to determine which signal is leading. This would allow the design engineer to take advantage of actual delay times in the system, as opposed to theoretical ones, thus allowing for a potentially faster clock speed. The result of such a system and method would be decreased processing time.

SUMMARY OF THE INVENTION

The foregoing needs are satisfied by the present invention, which provides a system and method for determining whether a reference signal and a feedback signal are synchronized within a given degree of tolerance. The present invention implements measuring circuitry consisting of three separate data latches. Each latch has a data and a clock input. The data input receives the feedback signal (hereinafter called the "sense") from the distant chip. The clock input of each latch receives a clock signal (hereinafter called the "reference") directly from the system clock or from another chip or slave clock. One of the latches is set up to determine which of the two incoming signals—the sense or the reference—arrives first. The other two latches have delay circuits built into the sense line or the reference line. These delay circuits are set up to create a time window for determining whether the two signals are in or out of sync. The output of these last two data latches is sent to an exclusive OR (XOR) gate. If the two signals arrive within a predetermined time window, then the outputs of these two data latches will always differ, resulting in an output of logical '1' from the XOR gate. If the two signals do not arrive within the specified time window, then the outputs of these two gates will be the same, resulting in an output of a logical '0' from the XOR gate. The overall result is as follows: this invention will receive two clock signals, determine whether the signals are synchronized, and if not, which of the two signals leads. The invention will put this information in the form of two outgoing signals.

To summarize, the electrical input to the invention consists of two signals, a sense signal and a reference signal, and the final output consists of two signals—one indicating whether the sense or reference arrived first (if either), and the other indicating whether the two signals are synchronized within a window of tolerance.

The foregoing has outlined rather broadly the features and technical advantages of the present invention in order that the detailed description that follows may be better understood. Additional features and advantages of the invention will be described hereinafter which form the subject of the claims of the invention.

BRIEF DESCRIPTION OF THE DRAWING

For a more complete understanding of the present invention, and the advantages thereof, reference is now made to the following descriptions taken in conjunction with the accompanying drawings, in which.

DETAILED DESCRIPTION OF A PREFERRED EMBODIMENT OF THE INVENTION

To describe more clearly the features of the present invention, discussion of other conventional features is omitted as being apparent to those skilled in the art. It is assumed that those skilled in the art are familiar with basic digital logic circuits and microprocessor fundamentals.

Figure 4:
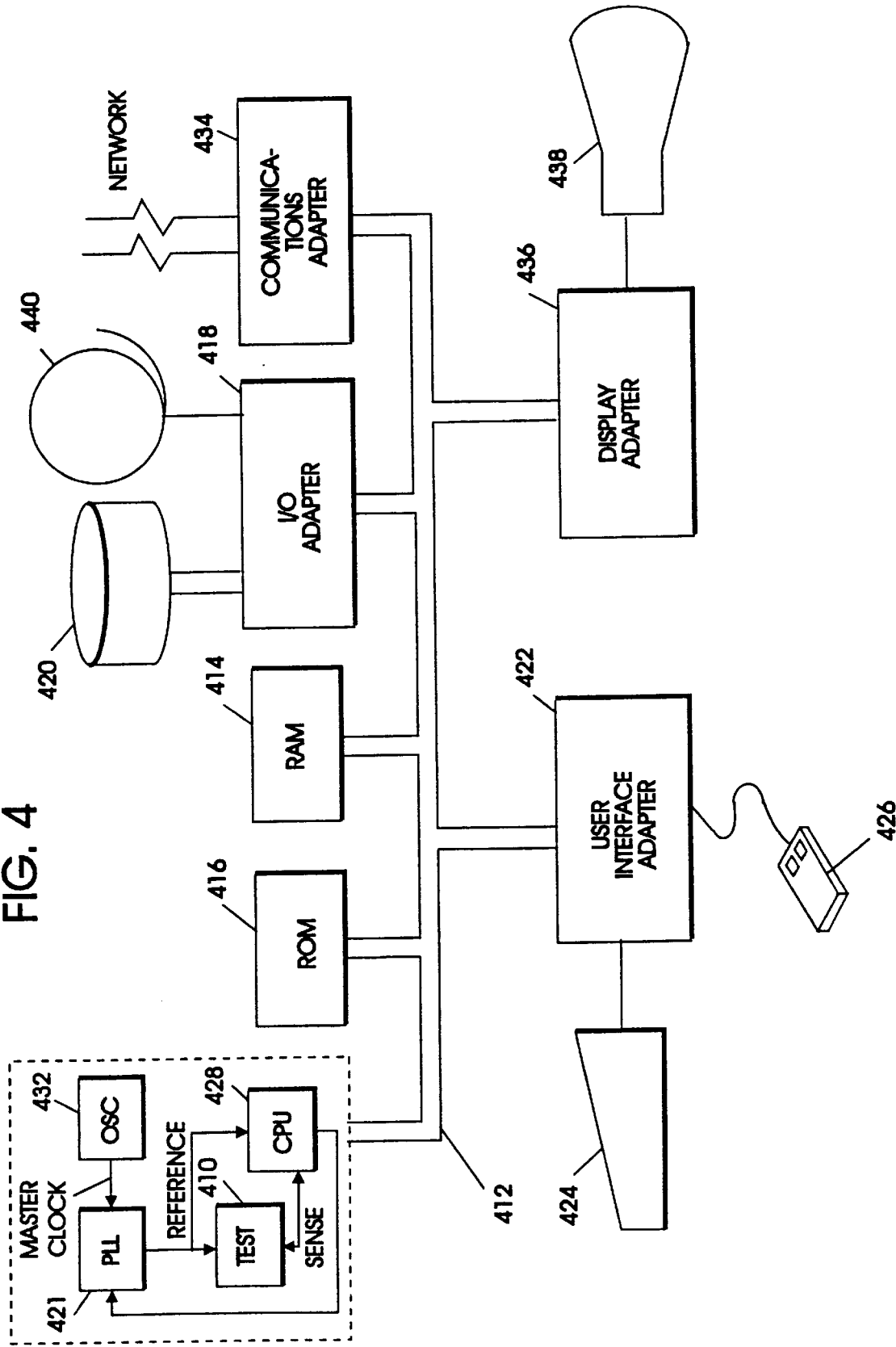
FIG. 4 illustrates a data processing system in accordance with the present invention.

Referring to FIG. 4, there is illustrated a data processing system using an embodiment of the present invention. FIG. 4 illustrates a typical hardware configuration of a workstation in accordance with the subject invention having processor 428, and a number of other units interconnected via system bus 412. The workstation shown in FIG. 4 includes random access memory (RAM) 414, read only memory (ROM) 416, and input/output (I/O) adapter 418 for connection of peripheral devices such as disk units 420 and tape drives 440 to bus 412, user interface adapter 422 for connecting keyboard 424, mouse 426, and/or other user interface devices such as a touch screen device (not shown) to bus 412, communications adapter 434 for connecting the workstation to a data processing network, and display adapter 436 for connecting bus 412 to display device 438.

As illustrated, CPU 428 is coupled to phase locked loop (PLL) circuit 421, test circuit 410 and oscillator 432. Generally, an oscillator is an electronic circuit that produces a periodically bearing output at a control frequency. Oscillator circuit 432 may produce the reference (Master) clock signal for input to both PLL circuit 421 and test circuit 410. Test circuit 410 is the subject of U.S. patent application, Ser. No. 08/441,571, assigned to a common assignee, and incorporated by reference herein.

The following conditions are assumed in this invention: 1) the phase detector is located on a chip (PLL 421) which receives a clock signal, either directly from the master clock or from a slave clock; 2) the chip on which the phase detector is located is relaying clock signals to a distant chip (CPU 428); 3) the phase detector is receiving feedback resulting from the relayed clock signals, said feedback signals originating at the distant chip (CPU 428); and 4) the distance between the two chips is such that it takes one full clock cycle for a signal to travel from one chip to the other and back. Assumption number four is not essential to the invention, as additional delay elements could be added to account for any cycle time. The assumption is made only for ease of explanation.

Figure 1:
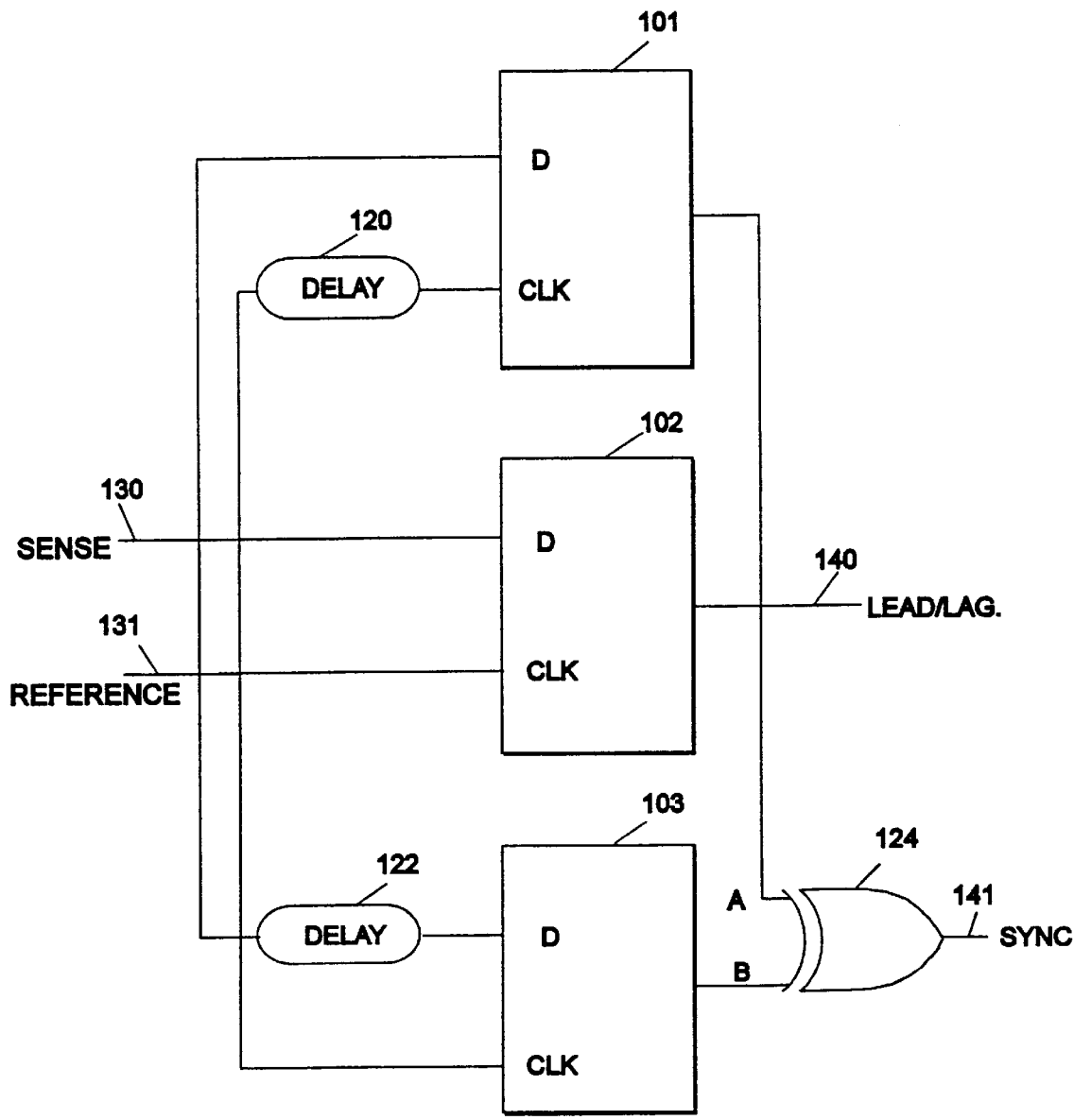
FIG. 1 illustrates a block diagram of logic circuits configured for three state phase detection in accordance with the present invention.

Referring to FIG. 1, there is illustrated an arrangement of logic circuits configured for three state phase detection in accordance with the present invention. Phase detector 301 is further illustrated in FIG. 3, and is located with respect to PLL 421. Phase detector 301 receives two incoming signals, the sense and the reference, on lines 130 and 131, respectively. The sense is the feedback from the distant chip (CPU 428), while the reference is the signal arriving from the master (OSC 432) or slave clock. The sense signal is a feedback signal of the reference signal at its arrival to CPU 428. These signals are distributed to three data latches, labeled 101, 102, and 103, which operate as set-reset flip-flops, and are leading edge triggered. Latch 102 is used to determine which signal, sense or reference arrives first. The resulting output, hereinafter called the "lead/lag bit" will be a '1' if the sense signal leads the reference signal, a '0' if the sense lags the reference signal, and ambiguous if the signals arrive simultaneously.

Latches 101 and 103 operate in concert to determine whether the two signals (sense and reference) arrive in sync to within a specified tolerance. In other words, if the leading edges of the sense and the reference arrive within a predetermined window of time, then they are considered to be in sync. The size of this window is determined by delay circuits 120 and 122. Delay circuit 120 receives the reference before it is inputted to the clock input to latch 101. Delay circuit 122 receives the sense signal before it is inputted into the D input of latch 103. The delays implemented within delay circuits 120 and 122 are predetermined by the designer of phase detector 301, and are determined by how close the designer of circuit 301 wishes the reference and sense clock signals to be before it is determined that they are in sync (the output line 141 of circuit 301). Delay circuits 120 and 122 may be any well-known circuit for delaying digital signals.

At latch 101, the reference signal will be delayed by circuit 120 by an amount of time equal to the allowed tolerance. At latch 103, the sense signal experiences a similar amount of delay. The results (A and B) of latches 101 and 103 pass through XOR gate 124.

Figures 1, 6A:
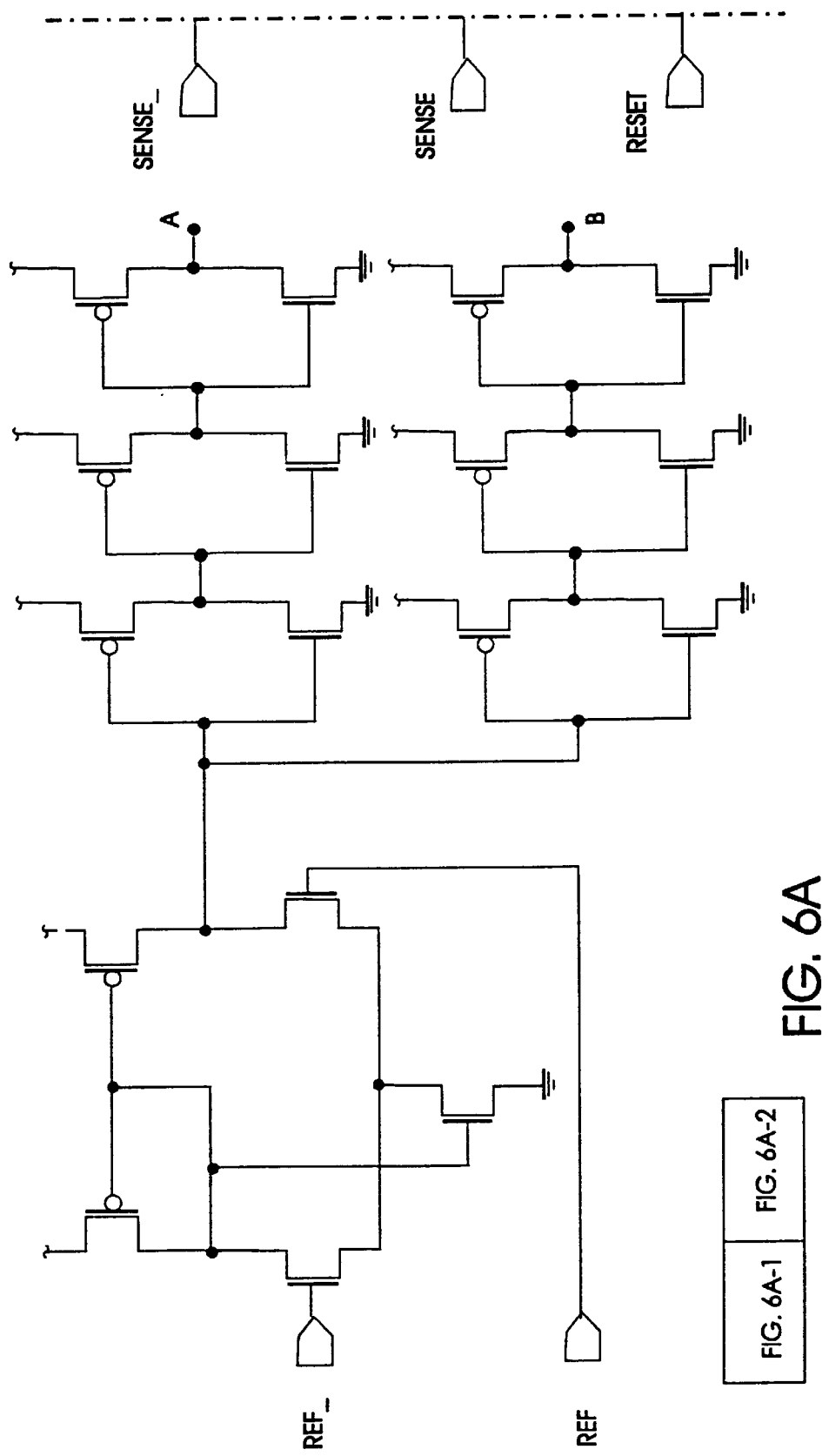
FIGS. 6A–6C illustrate a specific CMOS implementation of the detector circuit of the present invention.
Figures 2, 6A:
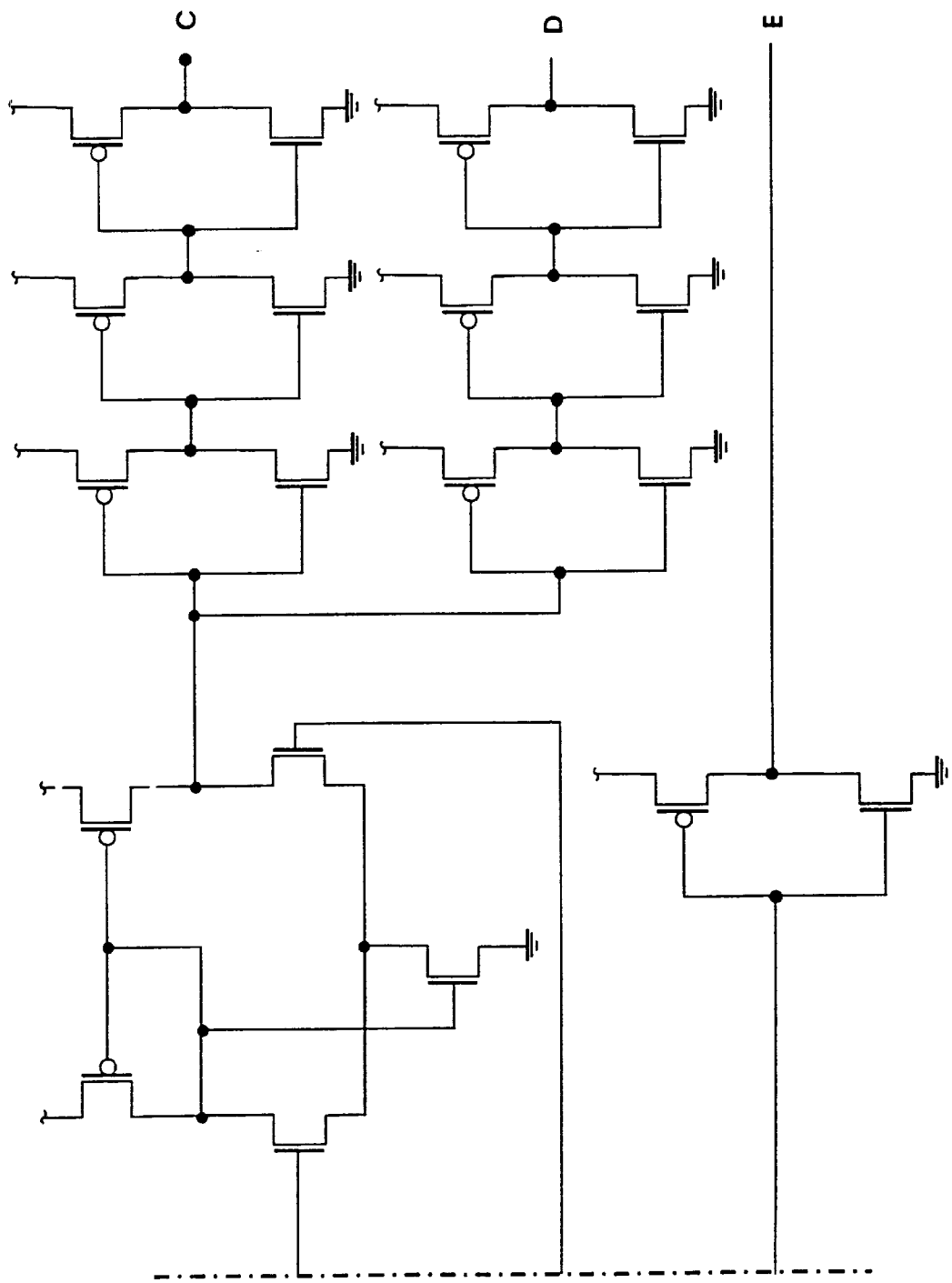
FIG. 2 illustrates a truth table showing the possible outputs of lines 140 and 141 from FIG. 1 given possible inputs of sense signal 130 and reference signal 131.

Referring to FIG. 2, there is illustrated a truth table showing the resulting outputs of gate 124, given the possible outputs of latches 101 and 103. If the reference and sense signals arrive within the desired time period of each other, then the output of latch 101 will always differ from that of latch 103. Thus, the output of the XOR gate, hereinafter called the "sync bit," will always be a '1' under those conditions, representing a synchronous state. If the sync bit is a '1' then the state of the lead/lag bit outputted on line 140 is irrelevant. If the reference and sense signals arrive outside of the permitted window, then the outputs of latch 101 and 103 will be identical, and the XOR output on line 141 will be a '0.' In such a case, the signals are considered out of sync. The lead/lag bit will indicate which signal arrived first, thereby indicating the direction the system needs to compensate (skew control 302 in FIG. 3).

Figure 3:
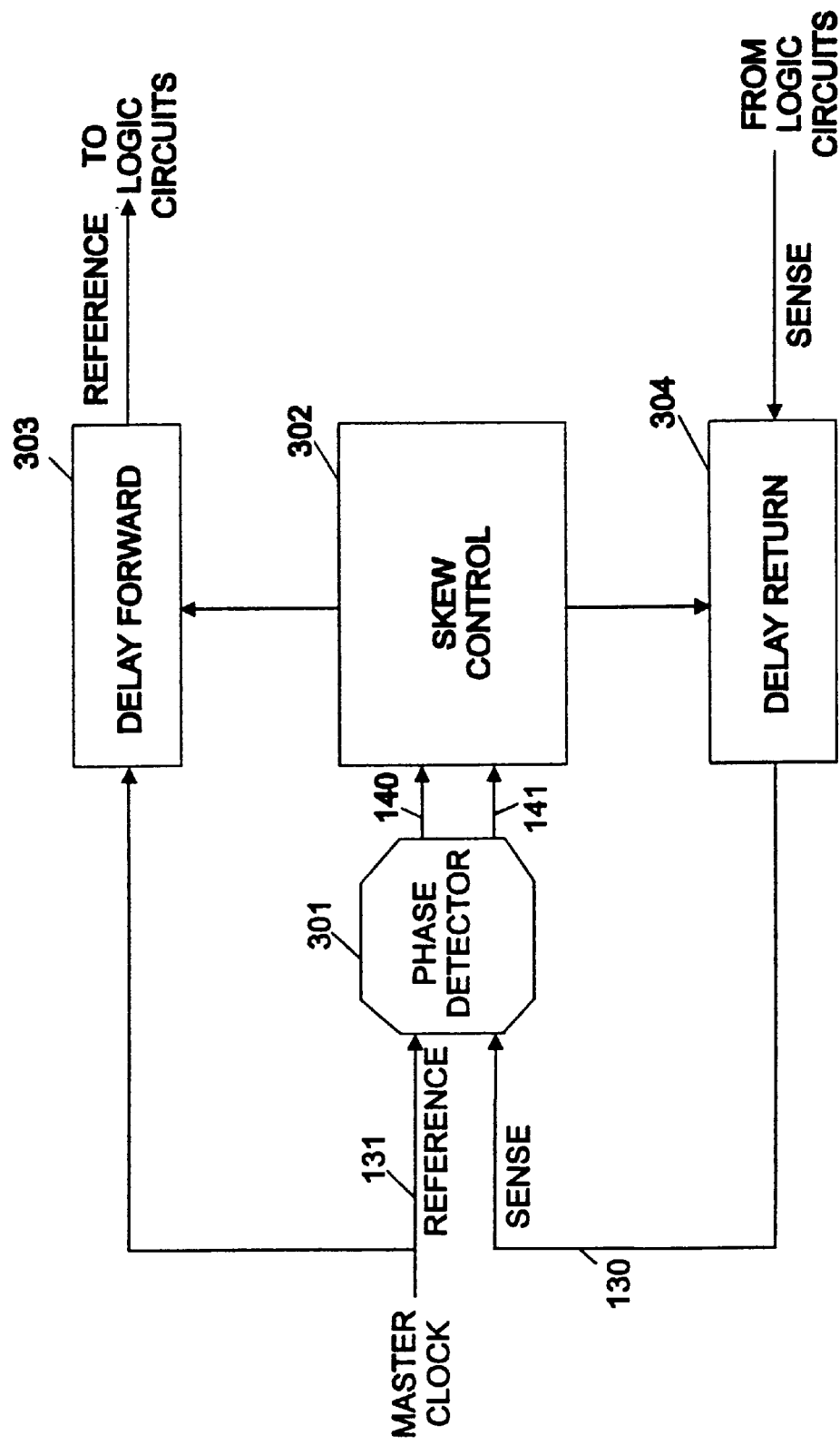
FIG. 3 illustrates a block diagram of one possible system in which the present invention plays a role.

FIG. 3 shows how phase detector 301 can be integrated into a larger timing system. In this set up, phase detector 301 receives both a sense and a reference signal, compares the state of the two signals as described previously with respect to FIG. 2, and sends the resulting output to skew control circuit 302 on lines 140 and 141. If the sense signal lags the reference signal, then skew control 302 will signal delay circuits 303 and 304. Delay circuits 303 and 304 will respond by reducing the amount of delay the reference and sense signals are experiencing when passing through circuits 303 and 304, by the same amount at each circuit. If phase detector 301 continues to detect a lagging condition in the sense signal, skew control 302 will continue signalling delay circuits 303 and 304 to reduce the amount of delay. This process will continue until phase detector 301 detects a synchronous state. When phase detector 301 detects a synchronous state, it will signal skew control circuit 302 as described above. In response, skew control circuit 302 will respond by ceasing its adjustments.

If the sense signal leads the reference signal, then skew control 302 will signal delay circuits 303 and 304. Delay circuits 303 and 304 will respond by increasing the amount of delay the reference and sense signals are experiencing when passing through circuits 303 and 304, by the same amount at each circuit. If phase detector 301 continues to detect a leading condition in the sense signal, skew control 302 will continue signalling delay circuits 303 and 304 to increase the amount of delay. This process will continue until phase detector 301 detects a synchronous state. When phase detector 301 detects a synchronous state, it will signal skew control circuit 302. Skew control circuit 302 will respond by ceasing its adjustments.

Figure 5:
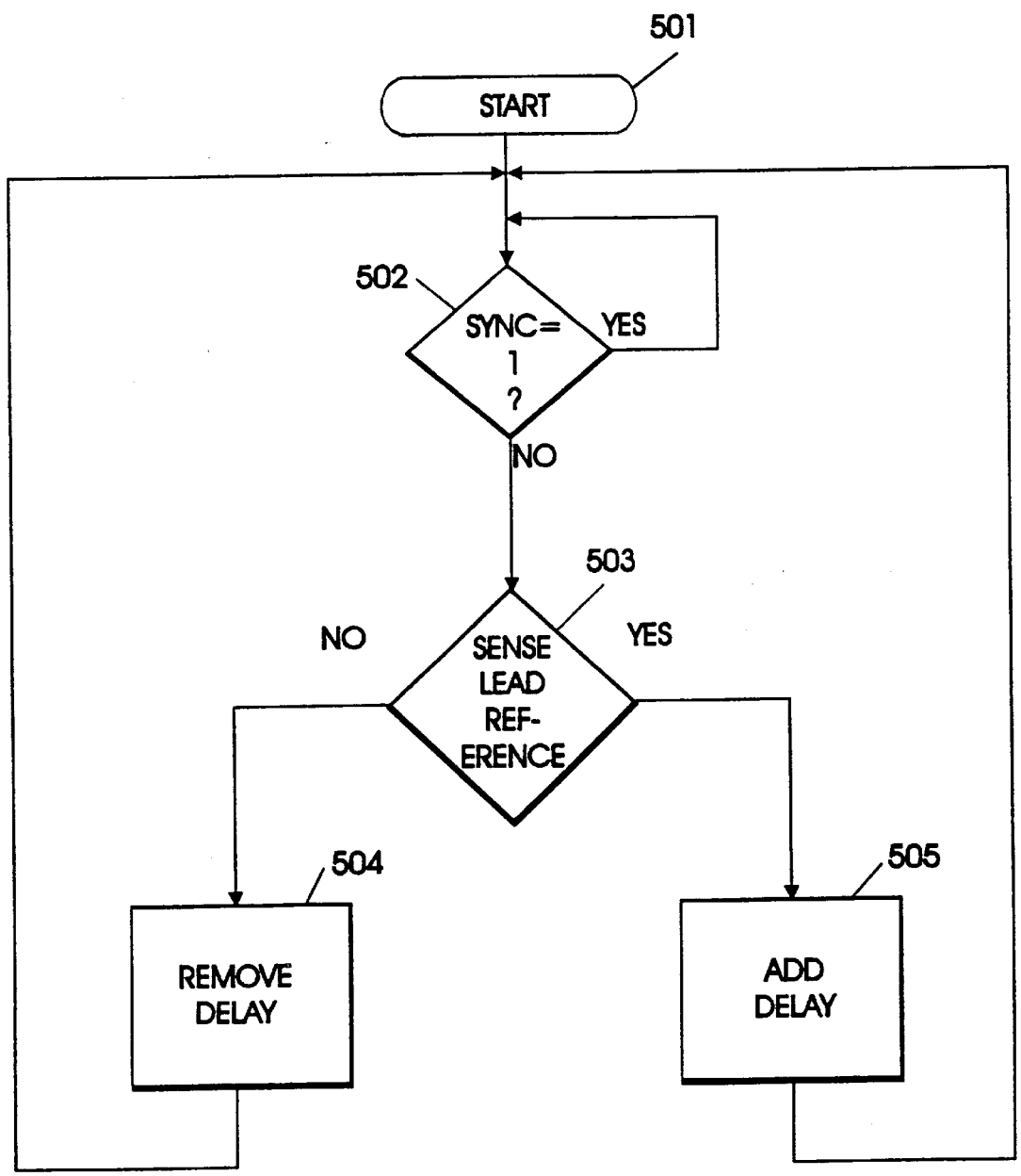
FIG. 5 illustrates a flow diagram of the operation of skew control circuit 302.

Skew control circuit 302 may be configured in accordance with the flow diagram illustrated in FIG. 5. The process begins at step 501 and proceeds to step 502 to determine whether or not the sync signal is a logical '1' or a logical '0'.

If the signal is a logical '1', then that means that the reference and sense signals are in phase within the predetermined tolerance value and skew control circuit 302 will essentially do nothing, and thus step 502 will loop upon itself until the sync signal goes to a logical '0' indicating that the reference and sense signals are no longer in phase within the predetermined tolerance value. The process proceeds to step 503 wherein skew control circuit 302 monitors the lead/lag signal to determine whether or not the sense signal is leading or lagging the reference signal. If the sense signal is leading the reference signal, then a logical '1' will be produced on line 140. This causes skew control circuit 302 to signal delay circuits 303 and 304 (step 504) to delay both the reference signal being transmitted to logic circuitry, and the sense signal being received as feedback. The process will then loop back to step 502 to determine if the sync signal has changed to a logical '1' indicating that the delay instituted by circuits 303 and 304 was sufficient to bring the reference and sense signals into synchronization within the tolerance value. The same is true for step 505 wherein skew control circuit 302 will signal delay circuits 303 and 304 to reduce the amount of delay should the sense signal lag the reference signal. After step 505, the process loops back to step 502. This process will continue until the sync signal produces a logical '1' indicating that the reference and sense signals are now within the specified tolerance value for synchronization. One skilled in the art of circuit design would be able to design control circuit 302 to embody the flow process illustrated in FIG. 5.

The output of delay circuit 303 is the reference circuit, which is supplied to logic circuits requiring clocking such as logic circuits residing within CPU 428. The return sense signal is transmitted from the logic circuits in CPU 428 back to PLL 421.

The circuitry of skew control 302 ignores the lead/lag signal arriving on line 140 if a '1' bit arrives on line 141 indicating that the reference and sense signals are in sync. Receiving such a signal on line 141 will cause skew control circuit 302 to not send signals to delay circuit 303 and delay circuit 304 so that the level of delay being experienced at both locations remains unchanged.

When the sync signal arriving on line 141 into skew control circuit 302 is a logical '0', circuit 302 is designed to monitor the state of the lead/lag signal arriving on line 140 to determine whether to force the delay circuits (303 and 304) to increase or decrease the amount of delay as discussed above.

Figures 1B, 6B:
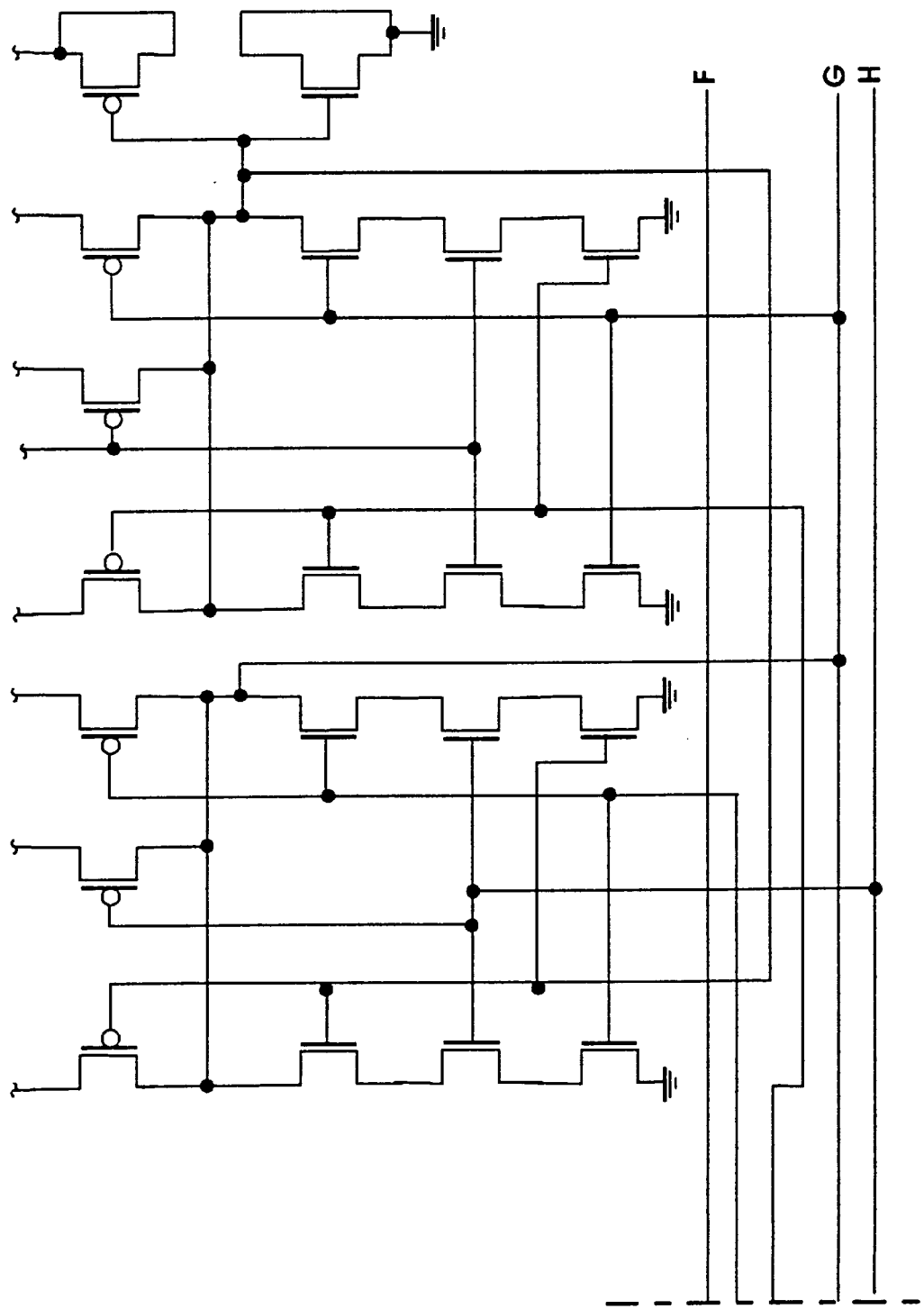
Figures 2A, 6B:
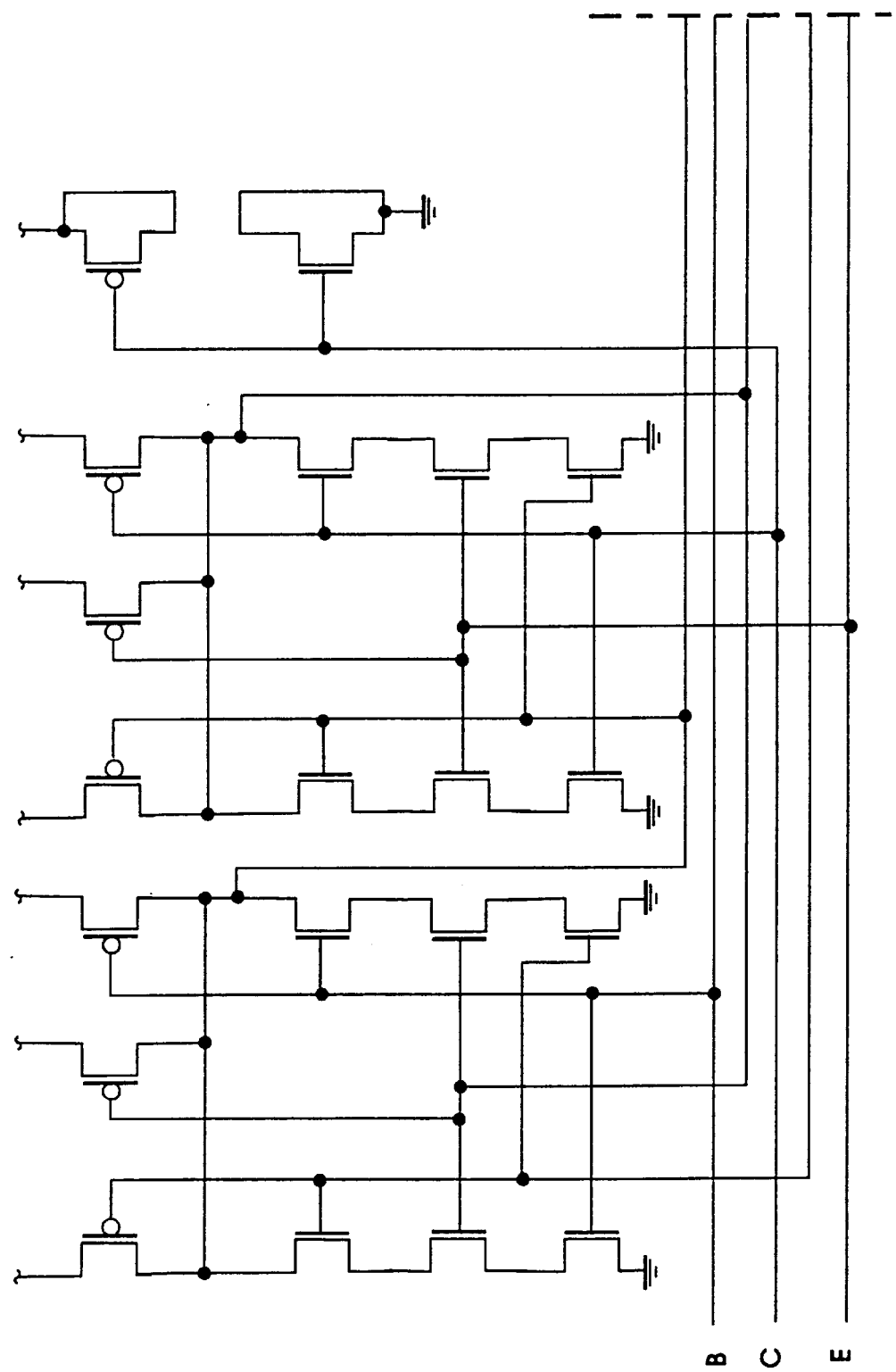
Figures 2B, 6B:
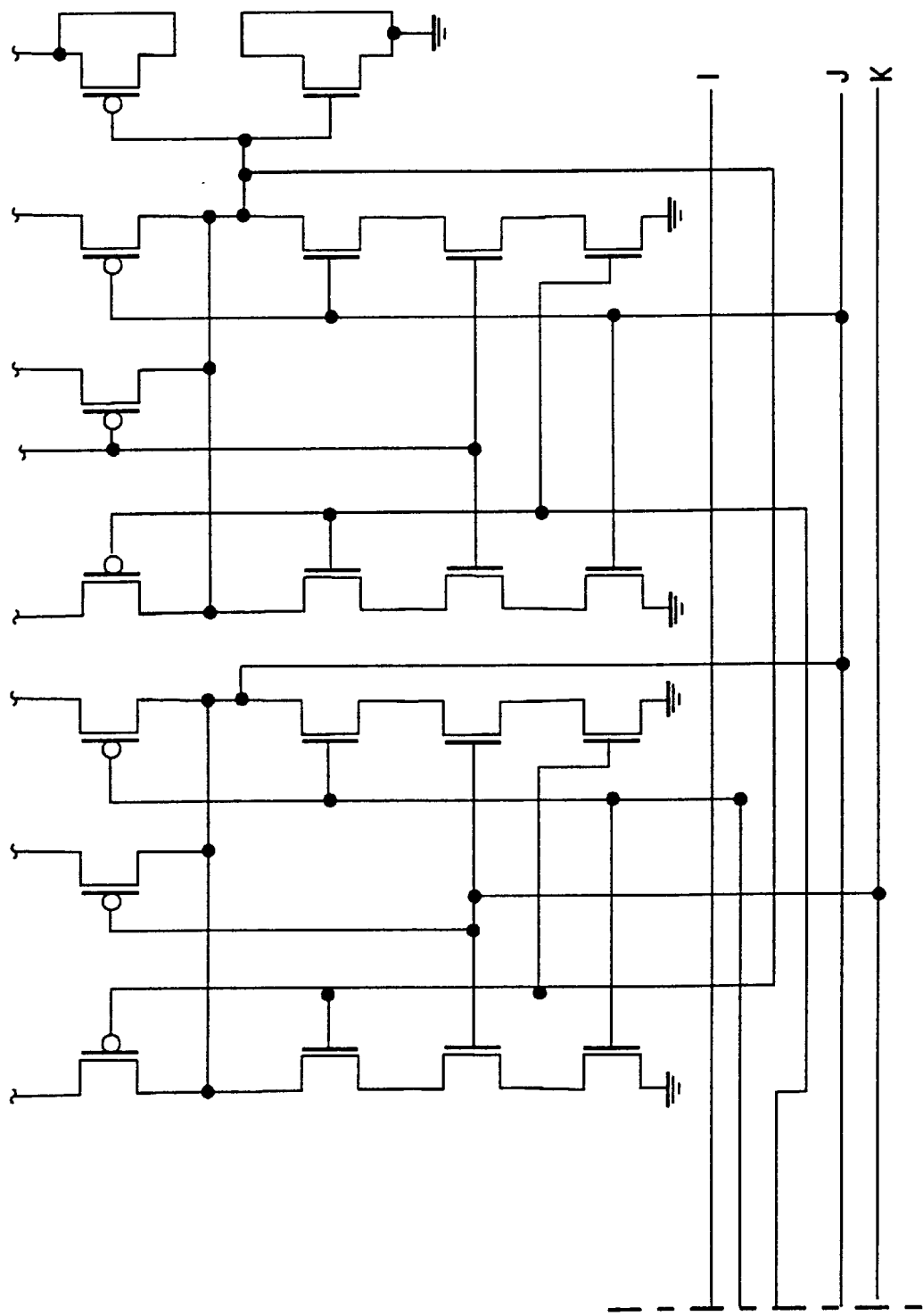
Figures 3A, 6B:
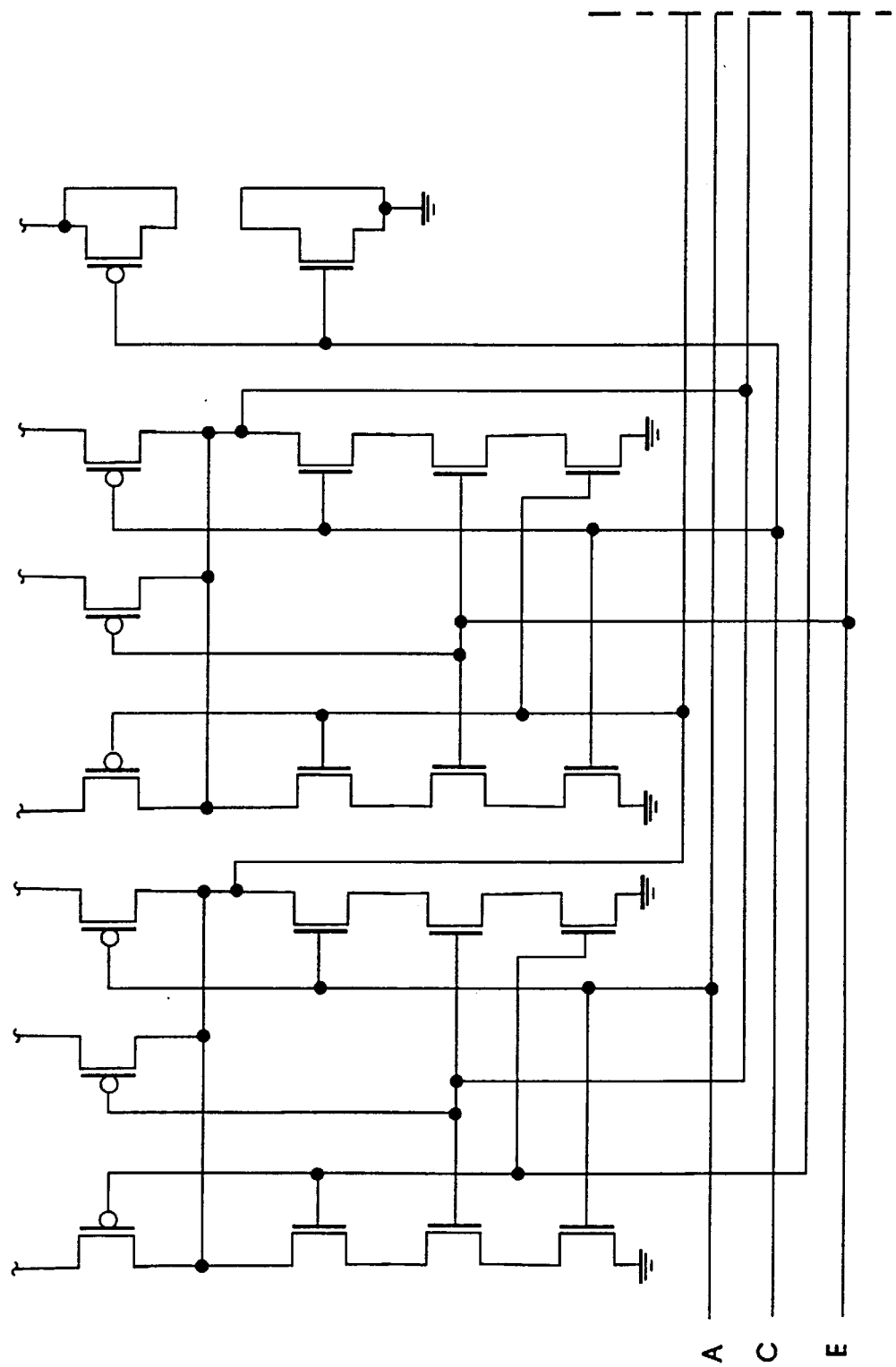
Figures 3B, 6B:
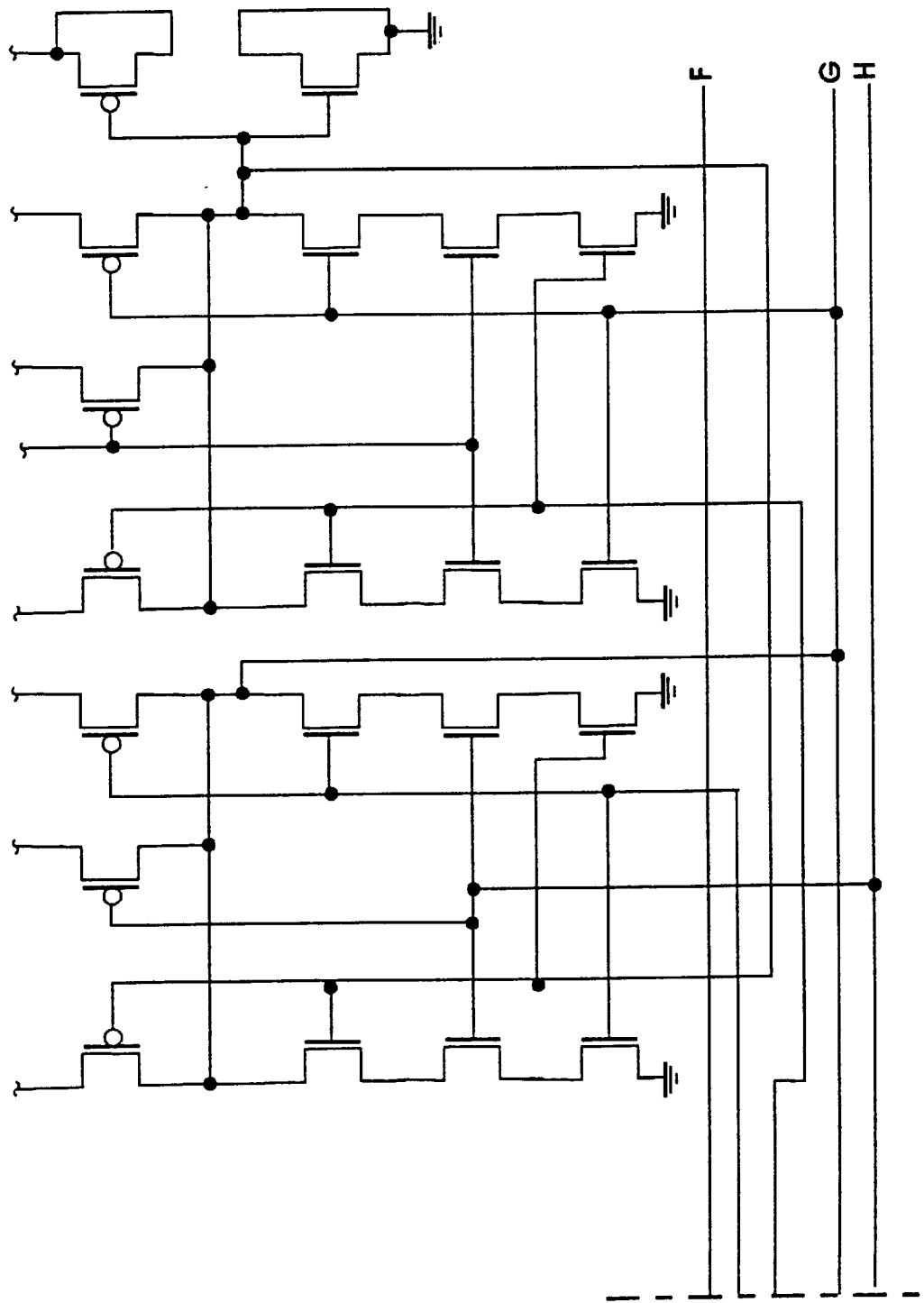
Figures 1, 6C:
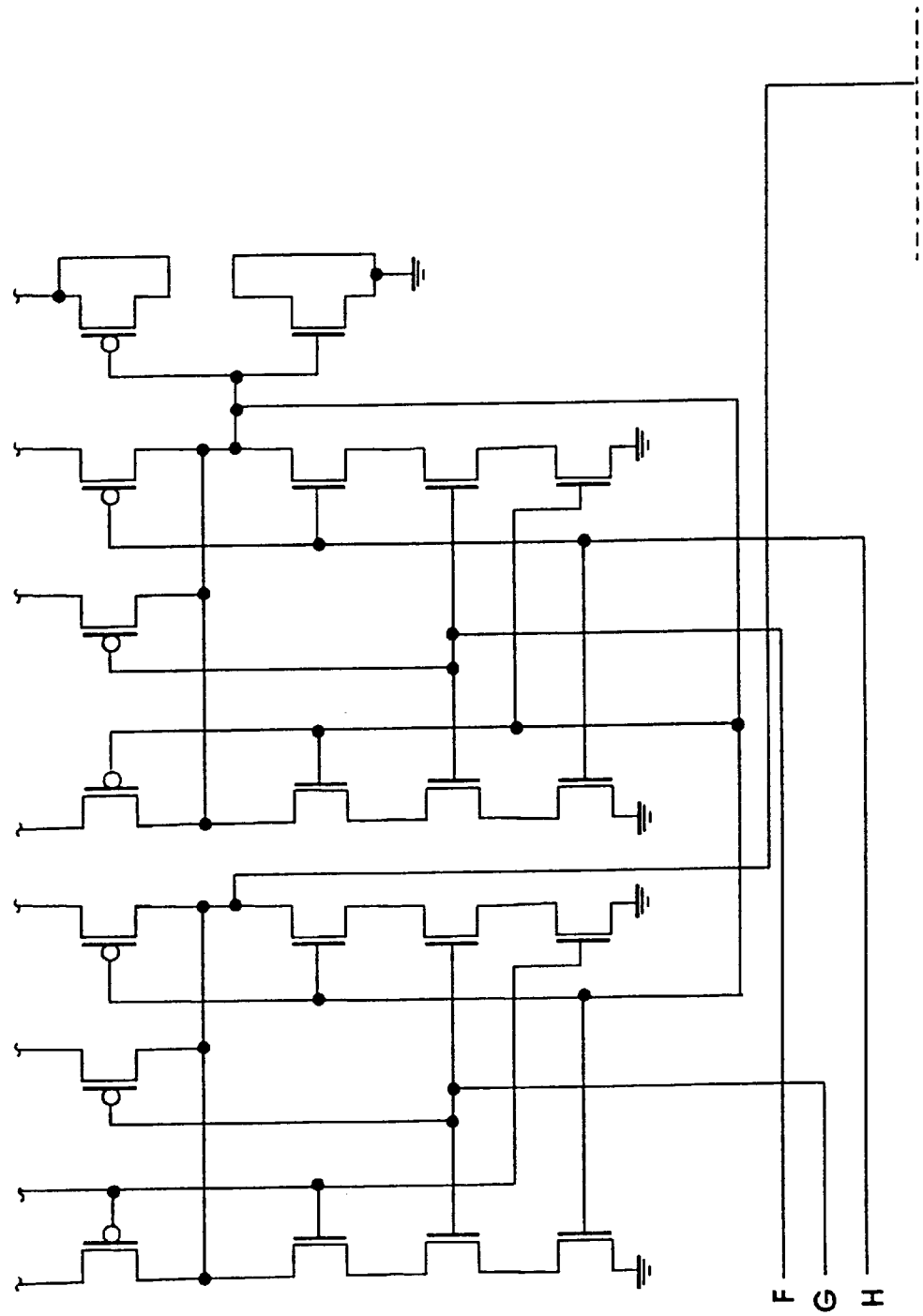
Figures 2, 6C:
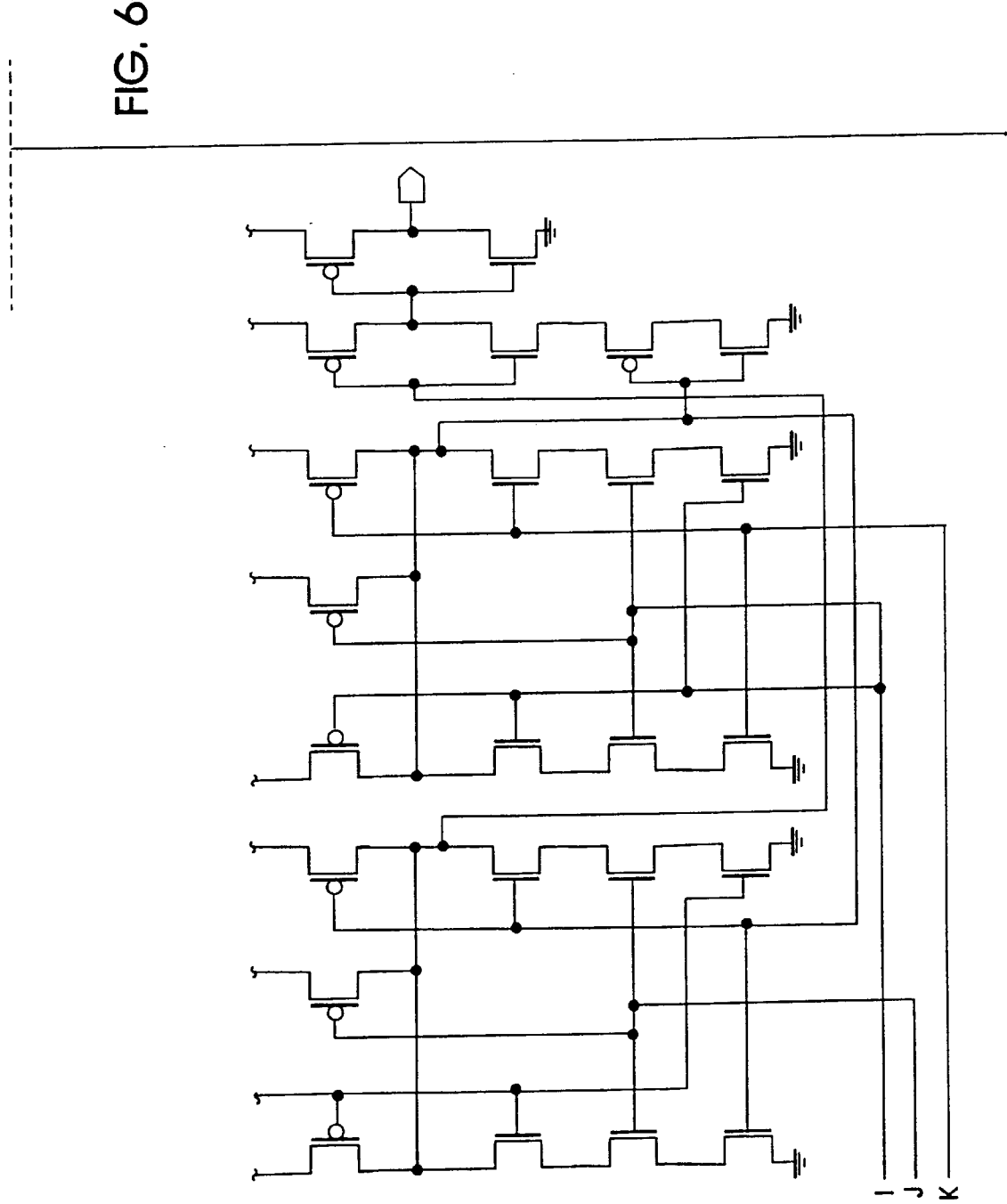
Figures 3, 6C:
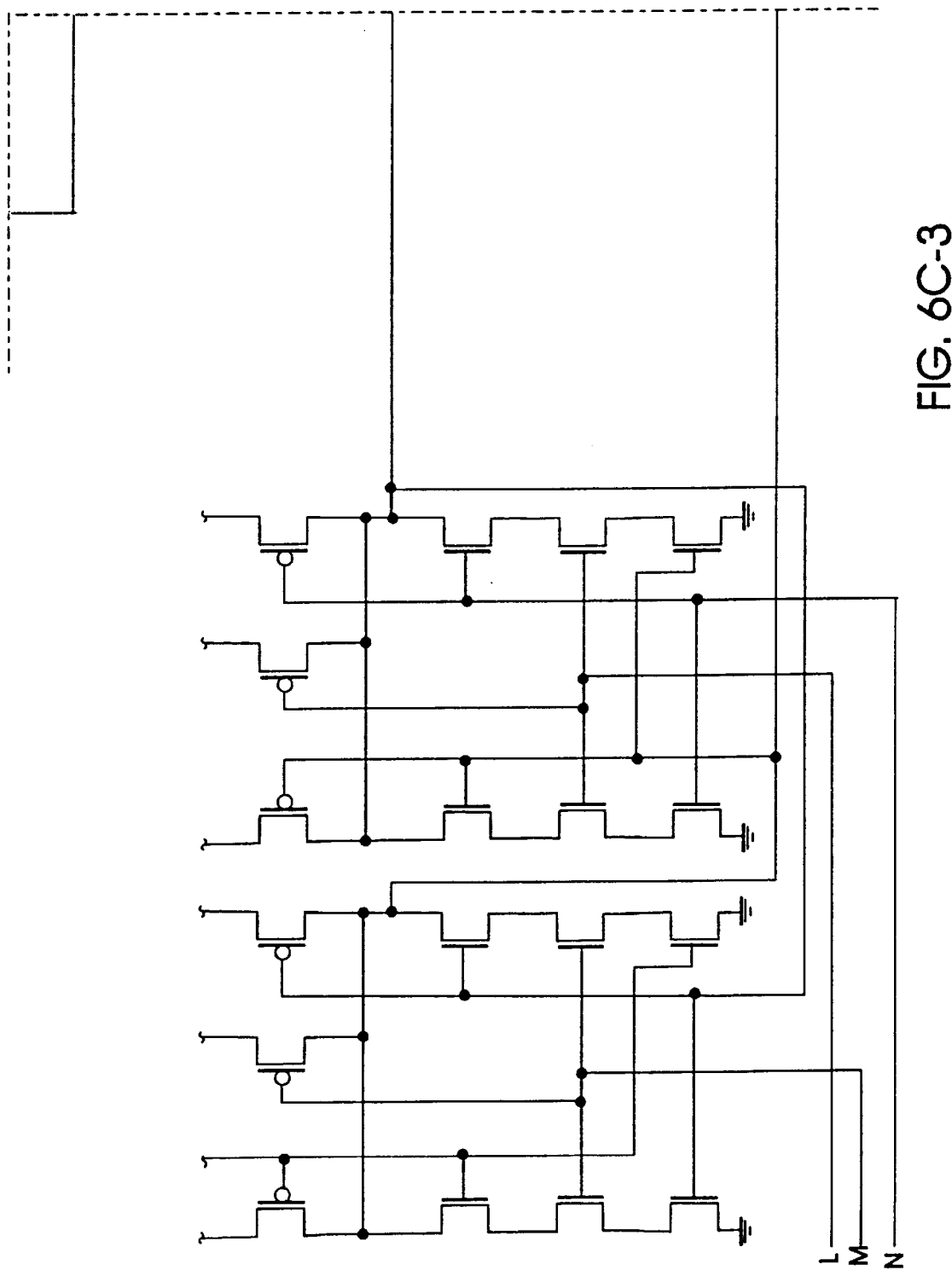

FIGS. 6A–6C illustrate a particular implementation of detector circuit 301 in CMOS circuitry. Note that an inverse of both the reference and sense signals is also supplied to circuit 301. The above descriptions and illustrations of circuit 301 were simplified to not include such inverse signals for the sake of simplicity of discussion. Note also a reset signal is utilized within circuit 301 in a manner similar to other circuit type utilizations of reset signals.

Although the present invention and its advantages have been described in detail, it should be understood that various changes, substitutions and alterations can be made herein without departing from the spirit and scope of the invention as defined by the appended claims.

What is claimed is:

1. A circuit, comprising:

means for receiving a first pulse of a first digital signal;

means for receiving a second pulse of a second digital signal;

means for determining if said first and second pulses are synchronized within a predetermined tolerance value; and means for determining which of said first and second pulses is leading the other, wherein said means for determining if said first and second pulses are synchronized within said predetermined tolerance value further comprises:
   a first latch circuit having an input coupled to said means for receiving said second pulse of said second digital signal;
   a first delay circuit coupled between said means for receiving said first pulse of said first digital signal and a clock input to said first latch circuit;
   a second latch circuit having a clock input coupled to said means for receiving said first pulse of said first digital signal;
   a second delay circuit coupled between said means for receiving said second pulse of said second digital signal and an input to said second latch circuit; and
   an XOR circuit having a first input coupled to an output of said first latch circuit and a second input coupled to an output of said second latch circuit.

2. The circuit as recited in claim 1, wherein said means for determining which of said first and second pulses is leading the other further comprises:
   a latch circuit having a clock input coupled to said means for receiving said first pulse of said first digital signal and an input coupled to said means for receiving said second pulse of said second digital signal.

3. The circuit as recited in claim 1, wherein said first and second delay circuits determine said predetermined tolerance value.

4. A circuit for adjusting skew in a digital clock signal, comprising:
   means operable for receiving said clock signal;
   means operable for transmitting said clock signal to a logic circuitry;
   means operable for receiving from said logic circuitry a feedback signal associated with said clock signal;
   means operable for determining if said clock signal and said feedback signal are synchronized within a predetermined tolerance value;
   means operable for determining which of said clock signal and said feedback signal is leading the other;
   means operable for removing delay from said feedback signal and said clock signal when said feedback signal is lagging said clock signal, wherein said means operable for removing delay from said feedback signal and said clock signal is coupled to said means for determining which of said clock signal and said feedback signal is leading the other and coupled to said means for determining if said clock signal and said feedback signal are synchronized; and
   means operable for delaying said feedback signal and said clock signal when said feedback signal is leading said clock signal, wherein said means operable for delaying said feedback signal and said clock signal is coupled to said means for determining which of said clock signal and said feedback signal is leading the other, and coupled to said means for determining if said clock signal and said feedback signal are synchronized.

5. The circuit as recited in claim 4, wherein said means operable for determining if said clock signal and said feedback signal are synchronized within said predetermined tolerance value further comprises:
   a first latch circuit having an input coupled to said means operable for receiving said feedback signal;
   a first delay circuit coupled between said means operable for receiving said clock signal and a clock input to said first latch circuit;
   a second latch circuit having a clock input coupled to said means operable for receiving said clock signal;
   a second delay circuit coupled between said means operable for receiving said feedback signal and an input to said second latch circuit; and
   an XOR circuit having a first input coupled to an output of said first latch circuit and a second input coupled to an output of said second latch circuit.

6. The circuit as recited in claim 4, wherein said means for determining which of said clock signal and said feedback signal is leading the other further comprises:
   a latch circuit having a clock input coupled to said means operable for receiving said clock signal and an input coupled to said means operable for receiving said feedback signal.

7. The circuit as recited in claim 5, wherein said first and second delay circuits determine said predetermined tolerance value.

8. The circuit as recited in claim 4, wherein said means for delaying said clock signal further comprises a third delay circuit operable for receiving said clock signal, wherein an output of said third delay circuit is coupled to said transmitting means, and wherein said means for delaying said feedback signal is coupled to said means operable for receiving said feedback signal and coupled to said logic circuitry.

9. A data processing system comprising:
   a processor coupled to a storage device, a memory device, an input device, and an output device via a bus, said processor further comprising:
   a clock source for producing a clock signal for use within logic circuitry in said processor;
   means operable for receiving said clock signal;
   means operable for transmitting said clock signal to said logic circuitry;
   means operable for receiving from said logic circuitry a feedback signal associated with said clock signal;
   means operable for determining if said clock signal and said feedback signal are synchronized within a predetermined tolerance value;
   means operable for determining which of said clock signal and said feedback signal is leading the other;
   means operable for removing delay from said feedback signal and said clock signal when said feedback signal is lagging said clock signal, wherein said means operable for removing delay is coupled to said means for determining which of said clock signal and said feedback signal is leading the other; and
   means operable for delaying said feedback signal and said clock signal when said feedback signal is leading said clock signal, wherein said means operable for delaying is coupled to said means for determining which of said clock signal and said feedback signal is leading the other.

10. The circuit as recited in claim 9, wherein said means for delaying said clock signal further comprises a third delay circuit operable for receiving said clock signal, wherein an output of said third delay circuit is coupled to said transmitting means, and wherein said means for delaying said feedback signal is coupled to said means operable for receiving said feedback signal and coupled to said logic circuitry.

11. The circuit as recited in claim 10, wherein said means operable for determining if said clock signal and said feedback signal are synchronized within said predetermined tolerance value further comprises:

a first latch circuit having an input coupled to said means operable for receiving said feedback signal;

a first delay circuit coupled between said means operable for receiving said clock signal and a clock input to said first latch circuit;

a second latch circuit having a clock input coupled to said means operable for receiving said clock signal;

a second delay circuit coupled between said means operable for receiving said feedback signal and an input to said second latch circuit; and an XOR circuit having a first input coupled to an output of said first latch circuit and a second input coupled to an output of said second latch circuit.

12. The circuit as recited in claim 11, wherein said means for determining which of said clock signal and said feedback signal is leading the other further comprises:

a third latch circuit having a clock input coupled to said means operable for receiving said clock signal and an input coupled to said means operable for receiving said feedback signal.

13. The circuit as recited in claim 12, wherein said first and second delay circuits determine said predetermined tolerance value.

* * * * *